US006991992B2

(12) United States Patent
Kim

(10) Patent No.: US 6,991,992 B2
(45) Date of Patent: Jan. 31, 2006

(54) METHOD FOR FORMING INDUCTOR IN SEMICONDUCTOR DEVICE

(75) Inventor: Young Keun Kim, Cheongju-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/876,728

(22) Filed: Jun. 28, 2004

(65) Prior Publication Data

US 2005/0037589 A1    Feb. 17, 2005

(30) Foreign Application Priority Data

Aug. 12, 2003  (KR) ................... 10-2003-0055820

(51) Int. Cl.
*H01L 21/20*  (2006.01)

(52) U.S. Cl. .................................... 438/381

(58) Field of Classification Search ............ 438/618, 438/636, 637, 640, 780, 943–950, 952, 381, 438/942; 257/E21.022, E21.023, E21.024, 257/531
See application file for complete search history.

(56) References Cited

U.S. PATENT DOCUMENTS

| 5,543,253 A | * | 8/1996 | Park et al. ................... 430/5 |
| 5,972,193 A | | 10/1999 | Chou et al. |
| 5,989,783 A | * | 11/1999 | Huggins et al. ............ 430/316 |
| 6,635,404 B1 | * | 10/2003 | Choi et al. .................. 430/311 |

* cited by examiner

*Primary Examiner*—Brook Kebede
(74) *Attorney, Agent, or Firm*—Mayer, Brown, Rowe & Maw LLP

(57) ABSTRACT

The present invention relates to a method for manufacturing an inductor being a passive device in RE MEMS, RFCMOS, Bipolor/SiGe and BiCMOS semiconductor devices. According to the present invention, a first negative photoresist layer is covered on a substrate having a lower electrode. A via hole that will become a contact portion of the inductor is then defined by means of an exposure process using a first mask. A second negative photoresist layer is covered on the first negative photoresist layer. Trenches that will become line portions of the inductor are defined by an exposure process using a second mask. A damascene pattern having the via hole and the trenches is formed by means of a developing process and is then buried with copper, thus forming the inductor. Not only a thickness of the trenches in the line portion and a thickness of the via hole in the contact portion can be uniformly controlled, but also their height can be easily controlled. Therefore, that an inductor of a high quality can be manufactured.

12 Claims, 6 Drawing Sheets

METHOD FOR FORMING INDUCTOR IN SEMICONDUCTOR DEVICE

BACKGROUND

1. Field of the Invention

The present invention relates to a method for forming an inductor in a semiconductor device, and more specifically, to a method for forming an inductor in a semiconductor device wherein a thickness at the line and contact portions of the inductor being a passive device is made uniform and their height is easily controlled in RE MEMS, RFCMOS, Bipolor/SiGe and BiCMOS semiconductor devices, thus allowing a high Q inductor to be manufactured.

2. Discussion of Related Art

In RE MEMS, RFCMOS, Bipolor/SiGe and BiCMOS semiconductor devices, an inductor being a passive device is formed by means of a damascene process with the device higher integrated, and an inductor of a high quality is required.

FIG. 1A to FIG. 1F are cross-sectional views shown to explain a conventional method for forming an inductor in a semiconductor device.

Referring to FIG. 1A, a lower electrode 11 is formed using a conductive material such as copper on a substrate 10 in which a predetermined underlying structure constituting a semiconductor device is formed. A positive photoresist layer 12 is covered on the substrate 10 including the lower electrode 11.

By reference to FIG. 1B, a primary exposure process is performed for some of the positive photoresist layer 12 up to the lower electrode 11 using a first mask 13. A first exposure region 12H is thus formed in a portion in which a contact of an inductor will be formed.

Referring to FIG. 1C, a secondary exposure process is performed for a portion of the positive photoresist layer 12 in a predetermined thickness using a first mask 14. Second exposure regions 12T are thus formed in portions in which lines of the inductor will be formed.

By reference to FIG. 1D, the first and second exposure regions 12H and 12T are developed to form trenches 15 in which the lines of the inductor is to be formed and a via hole 16 in which a contact of the inductor is to be formed.

Referring to FIG. 1E, the trenches 15 and the via hole 16 are buried with copper, forming the inductor 17.

By reference to FIG. 1F, the positive photoresist layer 12 is stripped to form the inductor 17 that is spaced apart from the substrate 10 by a predetermined distance.

In recent years, as semiconductor devices are higher integrated and are multi-functioned, copper (Cu) has been widely used as a material of the inductor in order to implement the inductor of a high quality. In order to facilitate the use of copper, a damascene process is performed at the same time. In order to obtain a desired quality factor of the copper inductor, Cu lines of several $\mu$m in thickness are required. In the aforementioned conventional method, the depth of a photoresist layer developed is controlled depending on the time when light is illuminated by means of a positive photoresist layer, thus controlling the line thickness of an inductor that is completed. In this method, however, it is difficult to control the line thickness exactly and uniformly. This is because the amount of a photoresist developed is non-uniform due to various external environments such as the composition of the photoresist when the process is performed, the components or composition of a photoresist developer, a process condition, intensity and time of light illuminated and the like.

SUMMARY OF THE INVENTION

An object of the present invention is to provide a method for forming an inductor in a semiconductor device wherein a thickness at the line and contact portions of the inductor is made uniform and their height is easily controlled, thus allowing a high Q inductor to be manufactured.

In order to accomplish the above object, according to an aspect of the present invention, there is provided a method for forming an inductor in a semiconductor device, comprising the steps of: forming a first negative photoresist layer on a substrate including a lower electrode; performing an exposure process for the first negative photoresist layer to form a first non-exposure region in the lower electrode portion; covering a second negative photoresist layer on the first negative photoresist layer; performing an exposure process for the second negative photoresist layer to form a second non-exposure region including the top of the first non-exposure region; implementing a developing process, whereby a via hole is formed in the first negative photoresist layer and trenches are formed in the second negative photoresist layer; and burying the via hole and the trenches with a conductive material.

In the above, after the first and second negative photoresist layers are covered, a soft bake process is performed, and after performing the exposure process for the first and second negative photoresist layers, a post expose bake process is performed.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIG. 2A to FIG. 2E are cross-sectional views shown to explain a method for forming an inductor in a semiconductor device according to an embodiment of the present invention.

Figure 1A:
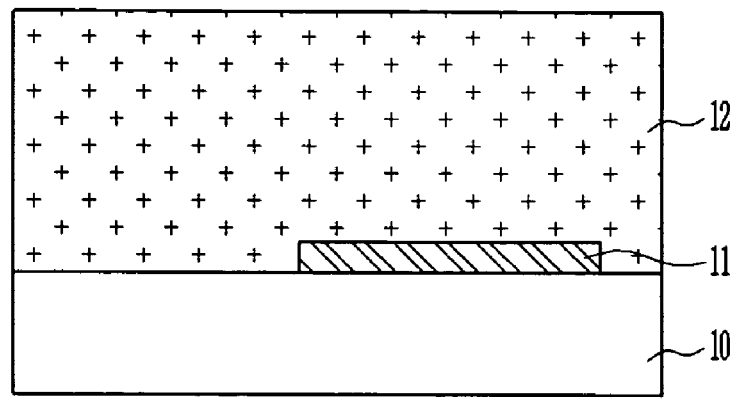
FIG. 1A to FIG. 1F are cross-sectional views shown to explain a conventional method for forming an inductor in a semiconductor device.
Figure 1B:
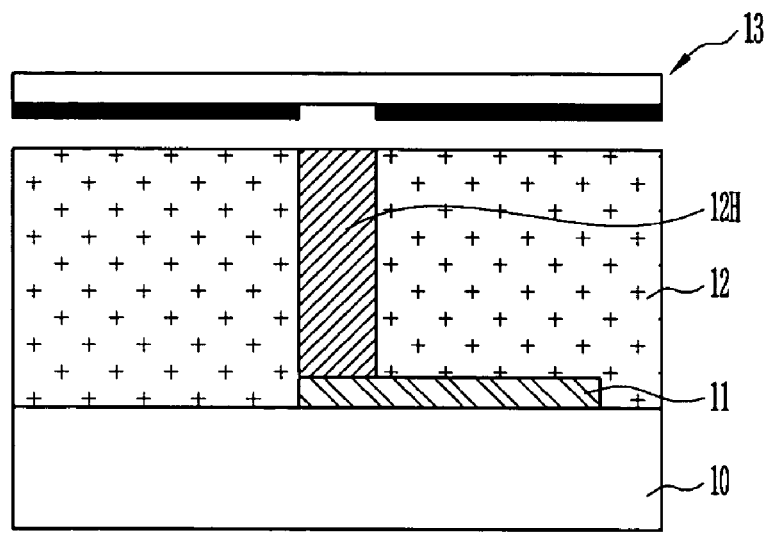
Figure 1C:
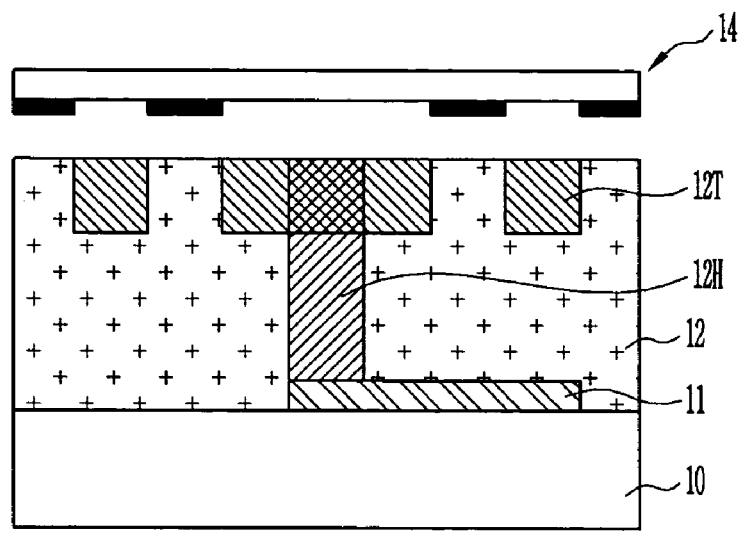
Figure 1D:
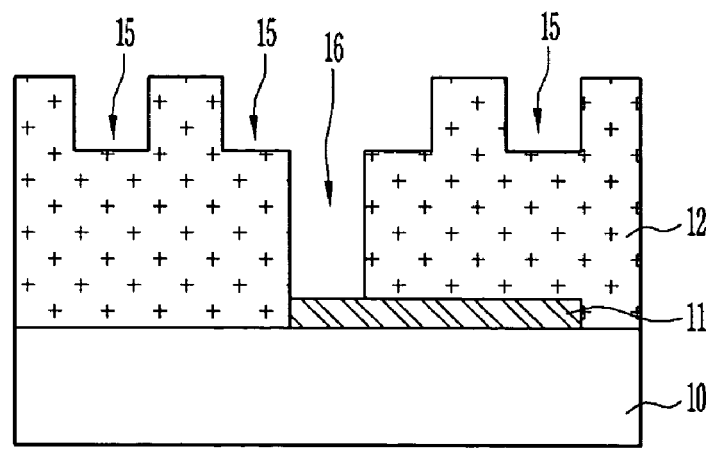
Figure 1E:
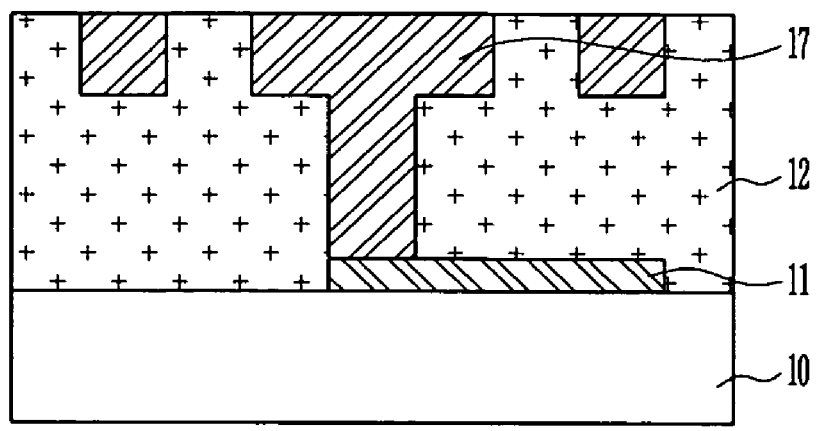
Figure 1F:
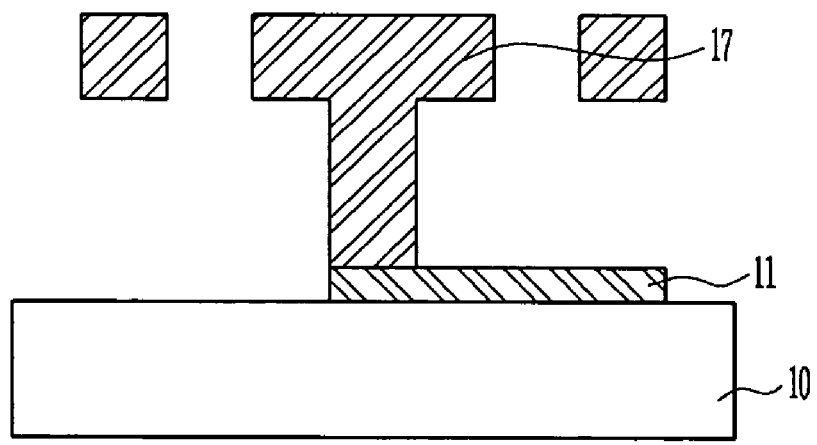
Figure 2A:
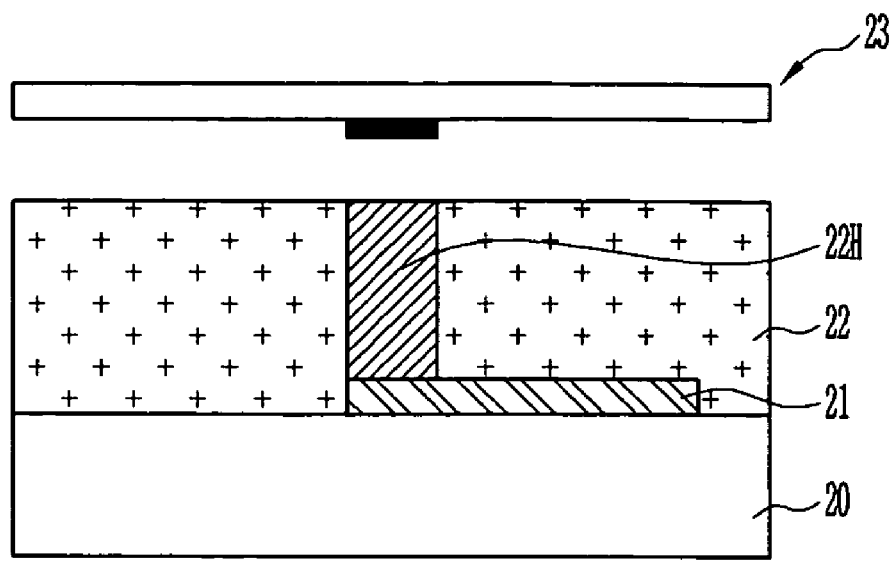
FIG. 2A to FIG. 2E are cross-sectional views shown to explain a method for forming an inductor in a semiconductor device according to an embodiment of the present invention.

Referring to FIG. 2A, a lower electrode 21 is formed on a substrate 20 in which a predetermined underlying structure constituting a semiconductor device is formed. A first negative photoresist layer 22 is covered on the substrate 20 including the lower electrode 21. After a soft bake process is performed, a primary exposure process is performed for some of the first negative photoresist layer 22 up to the substrate 20 using a first mask 23. A first non-exposure region 22H is thereby formed in a portion in which a contact of the inductor of the lower electrode 21 will be formed. A post expose bake process is then carried out.

In the above, the lower electrode 21 can be formed using a conductive material. In recent years, copper is widely used in order to meet higher-integration and multi-function of semiconductor devices. The thickness of the first negative photoresist layer 22 is determined considering the height of a contact portion in an inductor to be formed. The first mask 23 that defines the portion in which the contact of the inductor is to be formed has a mask tone opposite to the existing first mask 23 corresponding thereto. The first non-exposure region 22H becomes the portion in which the contact of the inductor will be formed. As a subject to be exposed is a negative photoresist material, polymerization reaction occurs in a portion to which light of the first negative photoresist layer 22 is incident. The first non-exposure region 22H that is not exposed is stripped in a subsequent developing process.

Figure 2B:
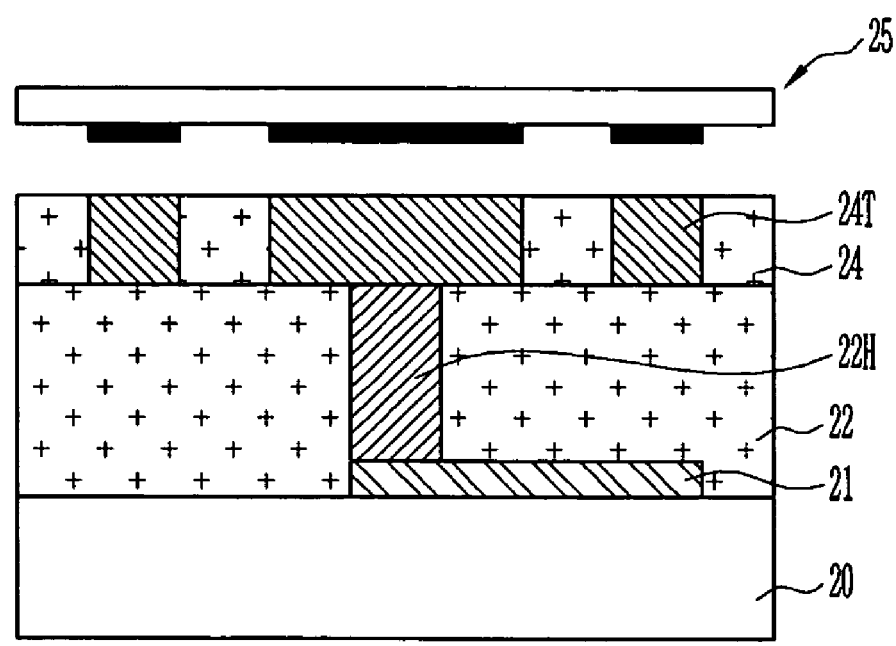

Referring to FIG. 2B, a second negative photoresist layer 24 is covered on the first negative photoresist layer 22 in which the first non-exposure region 22H is formed. After a soft bake process is formed, a secondary exposure process is implemented for some of the second negative photoresist layer 24 up to the first negative photoresist layer 22 using a second mask 25. Thereby, second non-exposure regions 24T are formed in regions in which lines of the inductor including the top of the first non-exposure region 22H are to be formed. A post expose bake process is then performed.

In the above, the thickness of the second negative photoresist layer 24 is determined considering the height of line portions of an inductor to be formed. The second mask 25 that defines the portion in which the lines of the inductor will be formed has a mask tone opposite to the existing second mask 24 corresponding thereto. The second non-exposure regions 24T become the portion in which the lines of the inductor will be formed. As a subject to be exposed is a negative photoresist material, polymerization reaction occurs in a portion to which light of the second negative photoresist layer 24 is incident. The second non-exposure region 24T that is not exposed is stripped in a subsequent developing process.

Meanwhile, polymerization reaction has already occurred in the first negative photoresist layer 22 beneath the portion to which light is incident during the exposure process of the second negative photoresist layer 24 since it receives the light in the first exposure process. Nothing effects are given to the first negative photoresist layer 22 even if light is incident thereto. In order to increase stability in the process, before the second negative photoresist layer 24 is covered, water-soluble BARC (Bottom Anti-Reflective Coating) can be covered as an anti-exposure and developing film on the first negative photoresist layer 22 in which the first non-exposure region 22H is formed.

Figure 2C:
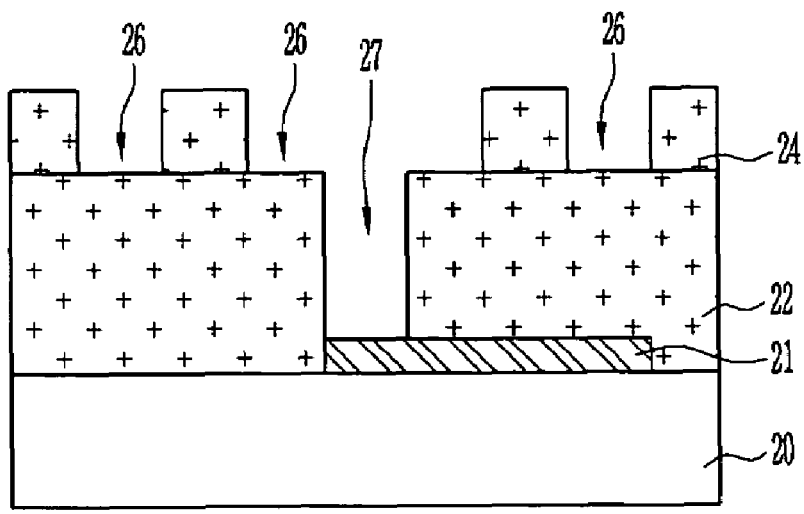

Referring to FIG. 2C, the second non-exposure regions 24T of the second negative photoresist layer 24 and the first non-exposure region 22H of the first negative photoresist layer 22 are developed. Therefore, trenches 26 are formed in a portions from which the second non-exposure regions 24T are removed, and a via hole 27 in which the lower electrode 21 becomes the bottom is formed in a portion from which the first non-exposure region 22H is removed.

Figure 2D:
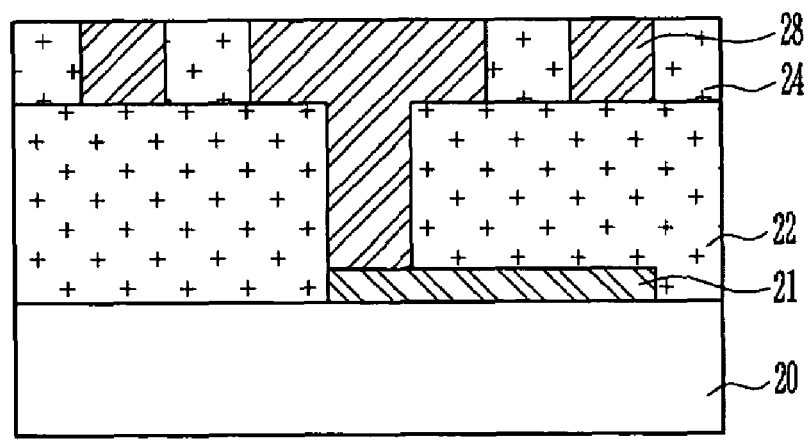

By reference to FIG. 2D, the first and second negative photoresist layers 22 and 24 in which the trenches 26 and the via hole 27 are formed are baked. The trenches 26 and the via hole 27 are buried with copper to form an inductor 28.

In the above, the burial of copper can be accomplished in such a way that if the lower electrode 21 is made of copper, the via hole 27 is buried by means of an electroplating method in which the copper lower electrode 21 is used as a seed layer, a seed layer is additionally formed on the inside of the trenches 26, and an electroplating method is then performed to bury the trenches 26, or a seed layer is formed on the inside of the trenches 26 and the via hole 27, and the trenches 26 and the via hole 27 are then buried at once by an electroplating method. Copper can be buried by means of a variety of methods other than the above burial method. It has been described in the present invention that the inductor is formed using copper. It is, however, to be noted that the inductor can be formed using other conductive materials.

Figure 2E:
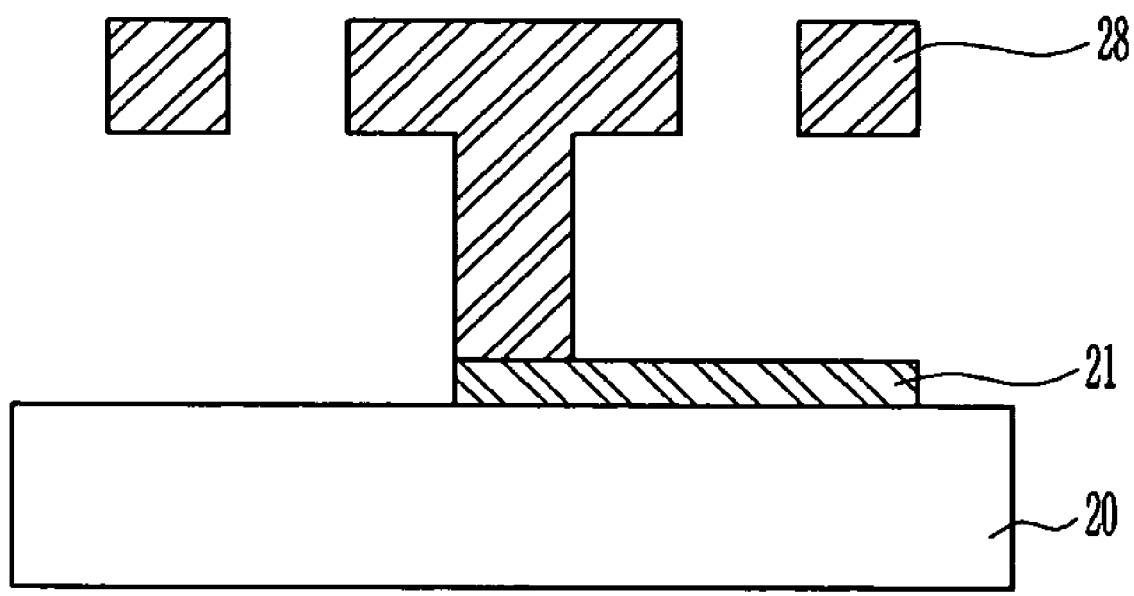

Referring to FIG. 2E, the first and second positive photoresist layers 22 and 24 are removed to complete an inductor 28 that is spaced apart from the substrate 20 by a predetermined distance.

In the above embodiment of the present invention, the trenches 26 in which the lines of the inductor will be formed can be formed in depth as high as the thickness of the second negative photoresist layer 24. The via hole 27 in which the contact of the inductor will be formed can be formed in depth as high as the thickness of the first negative photoresist layer 22. By controlling the thickness of the lines and contact of the inductor through the thickness of the first and second negative photoresist layers 22 and 24 as such, it is possible to obtain an exact and uniform inductor.

According to the present invention described above, in RE MEMS, RFCMOS, Bipolor/SiGe and BiCMOS semiconductor devices, a thickness of trenches being line portions of an inductor being a passive device and a thickness of a via hole being a contact portion of the inductor can be uniformly controlled and their height can be easily controlled. It is therefore possible to form a high Q inductor having the height of several to several tens of $\mu$m uniformly and to realize reliability and higher-integration of a device.

What is claimed is:

1. A method for forming an inductor in a semiconductor device, comprising the steps of:
    forming a first negative photoresist layer on a substrate including a lower electrode;
    performing an exposure process for the first negative photoresist layer to form a first non-exposure region in the lower electrode portion;
    performing a first post expose bake process after the exposure process for the first negative photoresist layer;
    covering a second negative photoresist layer on the first negative photoresist layer;
    performing an exposure process for the second negative photoresist layer to form a second non-exposure region including the top of the first non-exposure region;
    performing a second post expose bake process after the exposure process for the second negative photoresist layer;
    implementing a developing process whereby a via hole is formed in the first negative photoresist layer and trenches are formed in the second negative photoresist layer; and
    burying the via hole and the trenches with a conductive material.

2. The method as claimed in claim 1, wherein a soft bake process is performed after the first and second negative photoresist layers are covered.

3. The method as claimed in claim 1, wherein after the developing process is performed, the first and second negative photoresist layers are baked.

4. The method as claimed in claim 1, further comprising the step of before the second negative photoresist layer is covered, water-soluble BARC is covered as an anti-exposure and developing film on the first negative photoresist layer in which the first non-exposure region is formed.

5. The method as claimed in claim 1, wherein the conductive material is copper.

6. The method as claimed in claim 1, further comprising the step of after the conductive material is buried, stripping the first and second positive photoresist layers.

7. A method for forming an inductor in a semiconductor device, comprising the steps of:
- forming a first negative photoresist layer on a substrate including a lower electrode;
- performing an exposure process for the first negative photoresist layer to form a first non-exposure region in the lower electrode portion;
- covering water-soluble BARC on the first negative photoresist layer in which the first non-exposure region is formed;
- covering a second negative photoresist layer on the first negative photoresist layer;
- performing an exposure process for the second negative photoresist layer to form a second non-exposure region including the top of the first non-exposure region;
- implementing a developing process whereby a via hole is formed in the first negative photoresist layer and trenches are formed in the second negative photoresist layer; and
- burying the via hole and the trenches with a conductive material.

8. The method as claimed in claim 7, wherein a soft bake process is performed after the first and second negative photoresist layers are covered.

9. The method as claimed in claim 8, wherein a post expose bake process is performed after performing the exposure process for the first and second negative photoresist layers.

10. The method as claimed in claim 7, wherein after the developing process is performed, the first and second negative photoresist layers are baked.

11. The method as claimed in claim 7, wherein the conductive material is copper.

12. The method as claimed in claim 7, further comprising the step of after the conductive material is buried, stripping the first and second positive photoresist layers.

* * * * *